(12) United States Patent
Wagner

(10) Patent No.: US 11,528,032 B2
(45) Date of Patent: Dec. 13, 2022

(54) DEVICE FOR GENERATING ANALOGUE SIGNALS

(71) Applicant: Teledyne e2v Semiconductors SAS, Saint Egreve (FR)

(72) Inventor: Grégory Wagner, Saint Blaise du Buis (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 17/286,571

(22) PCT Filed: Nov. 18, 2019

(86) PCT No.: PCT/EP2019/081587
§ 371 (c)(1),
(2) Date: Apr. 19, 2021

(87) PCT Pub. No.: WO2020/109041
PCT Pub. Date: Jun. 4, 2020

(65) Prior Publication Data
US 2021/0344351 A1 Nov. 4, 2021

(30) Foreign Application Priority Data
Nov. 29, 2018 (FR) ...................................... 1872049

(51) Int. Cl.
*H03M 1/66* (2006.01)
*H03M 1/80* (2006.01)
(52) U.S. Cl.
CPC ............. *H03M 1/662* (2013.01); *H03M 1/66* (2013.01); *H03M 1/802* (2013.01)

(58) Field of Classification Search
CPC ......... H03M 1/662; H03M 1/66; H03M 1/802
USPC .................................................. 341/141, 144
See application file for complete search history.

(56) References Cited

U.S. PATENT DOCUMENTS

| | | | |
|---|---|---|---|
| 7,042,379 B2 * | 5/2006 | Choe | H03M 1/0881 341/144 |
| 7,190,751 B1 | 3/2007 | Ogilvie | |
| 7,796,971 B2 | 9/2010 | Li et al. | |

(Continued)

FOREIGN PATENT DOCUMENTS

EP          0399120 A2          11/1990

OTHER PUBLICATIONS

Hawksford et al., "An Oversampled Digital PWM Linearization Technique for Digital-to-Analog Conversion", IEEE Transactions on Circuits and Systems—I: Regular Papers, vol. 51, No. 9, Sep. 2004, pp. 1781-1789.

(Continued)

*Primary Examiner* — Khai M Nguyen
(74) *Attorney, Agent, or Firm* — K&L Gates LLP

(57) ABSTRACT

Device for generating analogue signals comprises a digital-to-analogue converter comprising at least one digital input and one analogue output, a circuit for generating a first clock signal of frequency fs, and a digital register configured so as to receive at the input and to store N bits representative of an analogue output signal of the converter, N being an integer greater than or equal to 1, and for receiving the first clock signal, the register comprising, for each bit, two complementary digital outputs.

10 Claims, 3 Drawing Sheets

(56) References Cited

U.S. PATENT DOCUMENTS

| | | | |
|---|---|---|---|
| 8,493,257 B2* | 7/2013 | Nagatani | H03M 1/662 |
| | | | 341/145 |
| 8,659,458 B1 | 2/2014 | Choe et al. | |
| 9,041,577 B2* | 5/2015 | Bore | H03M 1/0881 |
| | | | 341/144 |
| 9,419,636 B1* | 8/2016 | Graham | H03M 1/0836 |
| 9,571,160 B2* | 2/2017 | Galy | H04L 25/4917 |
| 10,069,508 B1* | 9/2018 | Zhang | H03M 1/662 |

OTHER PUBLICATIONS

Rewatkar et al., "Comparative Analysis of Low Power High Speed Upsampler and Downsampler using Multirate", 2014 International Conference on Circuit, Power and Computing Technologies [ICCPCT], pp. 1180-1184.

Snow, John F., "Efficient 8X Oversampling Asynchronous Serial Data Recovery Using IDELAY", Application Note: Virtex-4 and Virtex-5 FPGA Families, XILINX, XAPP861 (v1.1) Jul. 20, 2007, 11 pages.

International Search Report and Written Opinion of the International Searching Authority for PCT/EP2019/081587 dated Jan. 8, 2020.

* cited by examiner

[Fig. 1]
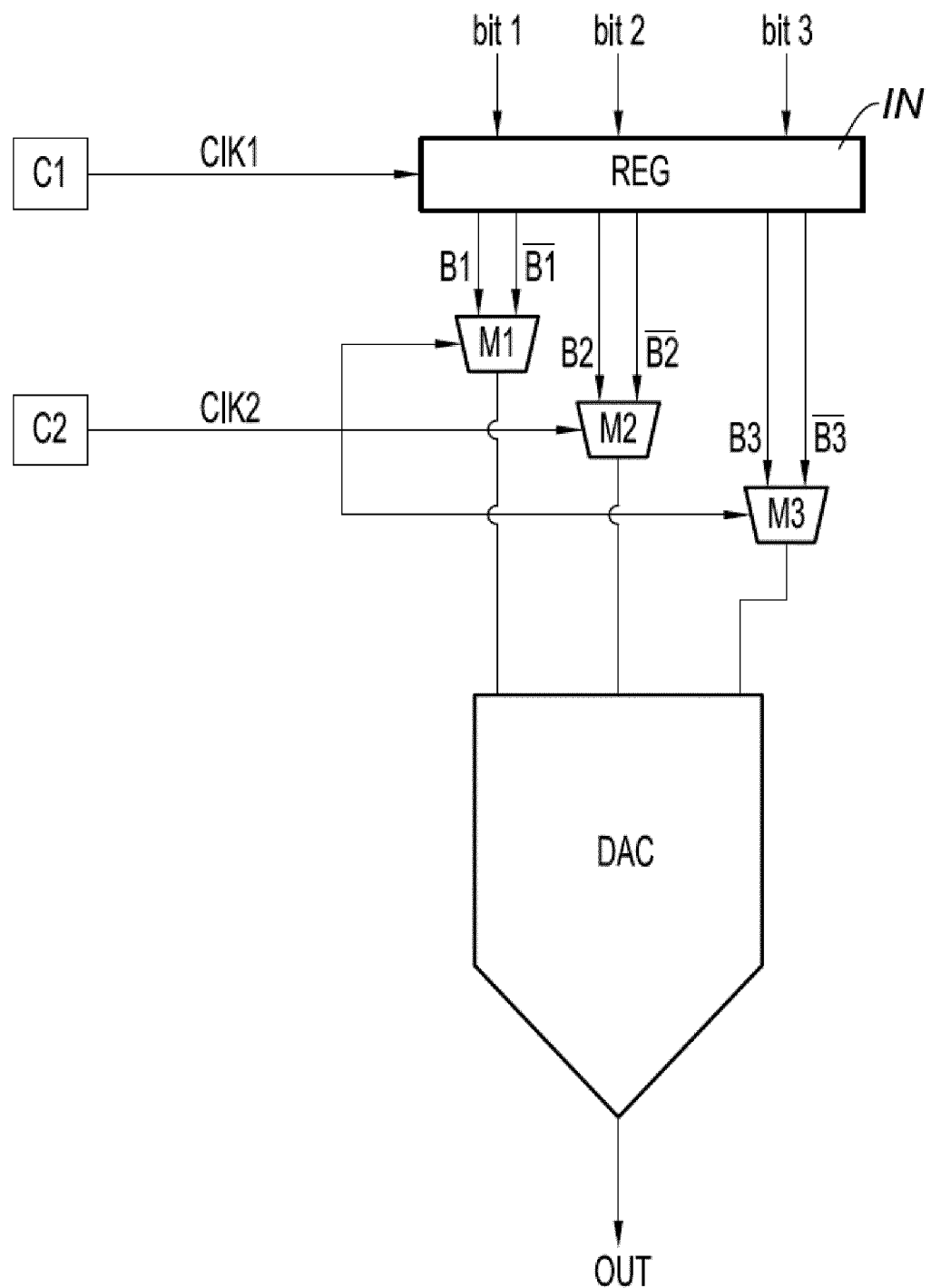

[Fig. 2]
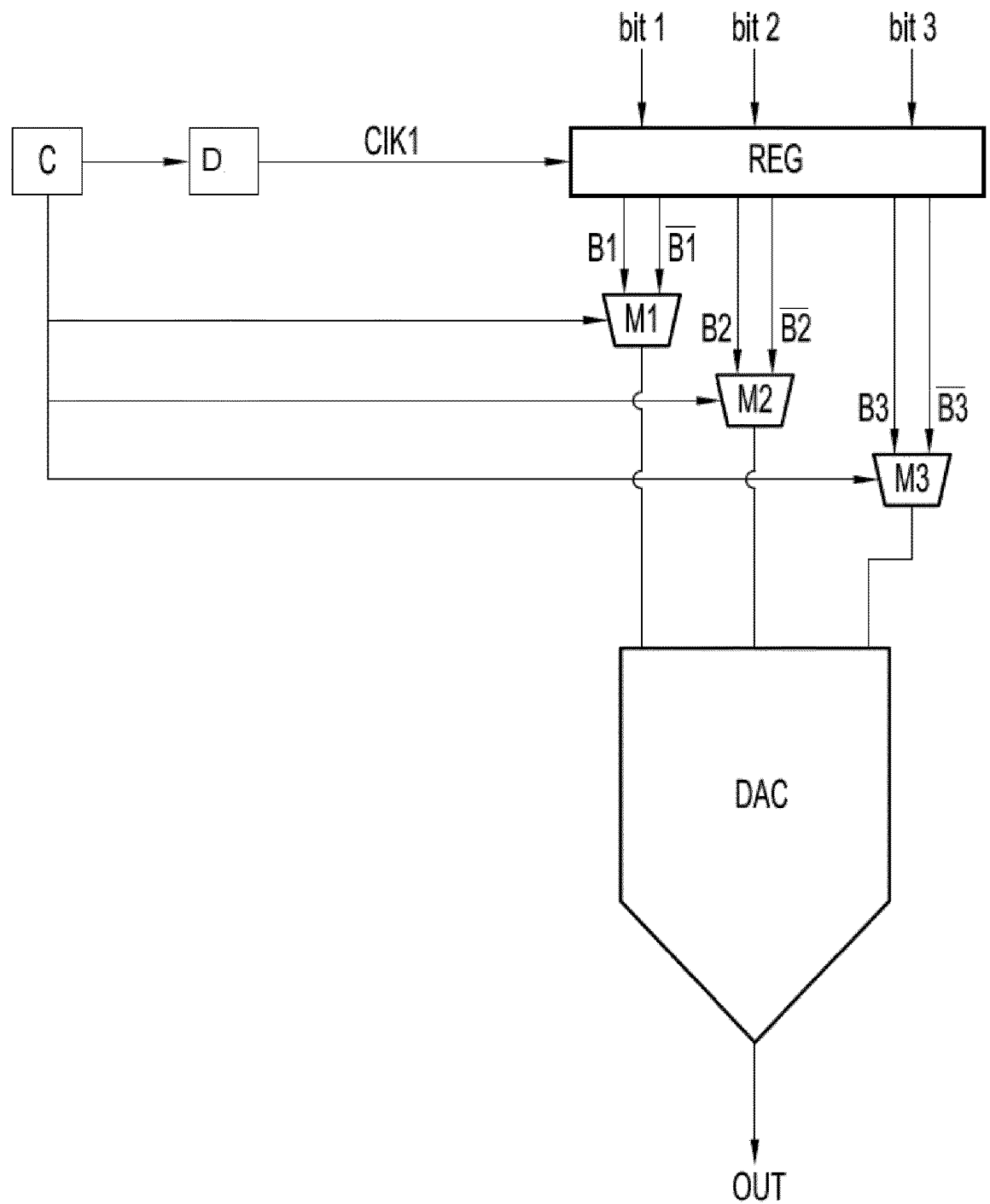

[Fig. 3]
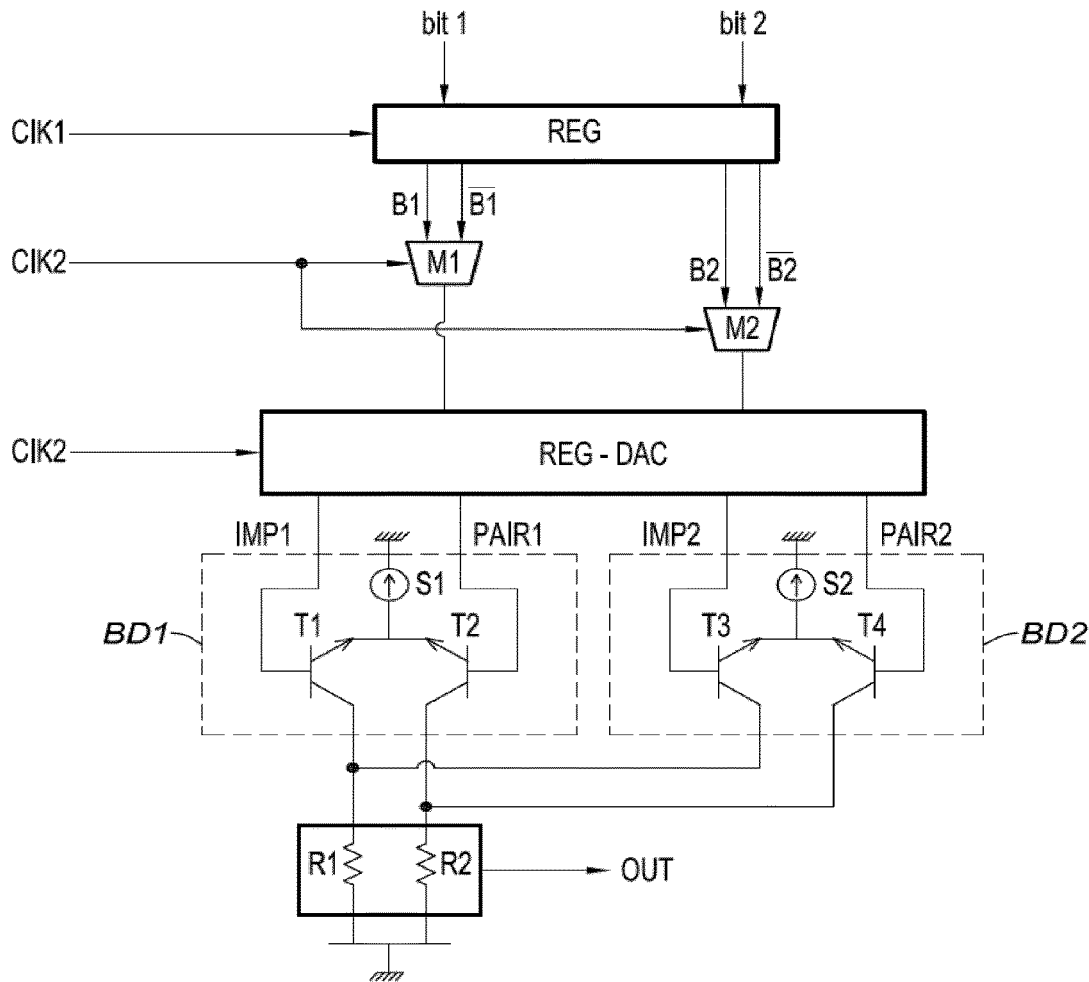
[Fig. 4]
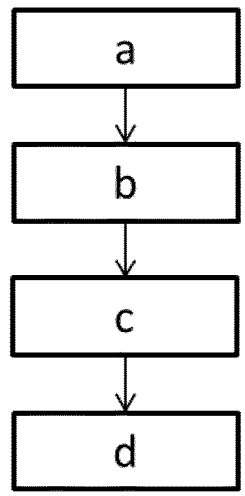

DEVICE FOR GENERATING ANALOGUE SIGNALS

CROSS REFERENCE AND STATEMENT OF PRIORITY

This application is a U.S. National Stage Entry under 35 U.S.C. § 371 of International Patent Application No. PCT/EP2019/081587, entitled DEVICE FOR GENERATING ANALOGUE SIGNALS, filed Nov. 18, 2019, which further claims priority to French Patent Application Number 1872049, filed Nov. 29, 2018, the contents of all of which are incorporated herein by reference in their entirety and for all purposes.

The invention relates to the generation of analogue signals from a digital code with high output frequency, in particular greater than the sampling frequency, while retaining performances close to the first Nyquist zone and limiting the number of components in the signal processing chain.

Generally speaking, an actual digital-to-analogue converter has a step output or supplies pulses of finite width. The spectral response of the converter is reflected in a sine cardinal. The power response of the converter therefore allows a signal with a wide dynamic range to be generated in the first and second Nyquist zones, in other words between 0 and fs/2 and between fs/2 and fs, where fs is the sampling frequency of the digital signal. As soon one wishes to synthesize a signal beyond the sampling frequency fs (for example at 2fs or more), the signal is severely attenuated.

In order to remedy this, it is possible to use a multiplier placed at the output of the converter which will translate the frequency of the generated signal by virtue of a convolution with a frequency fm. The analogue system coming from the converter will then be translated around the frequency fm, which will allow a rise in frequency of the signal from the converter (if fm>fs/2) with a dynamic range equivalent to that of the converter in the first Nyquist zone. However, this solution requires an additional active element, notably a radiofrequency source, in order to generate the signal frequency fm. This increases the noise, distortion and consumption of the converter. Moreover, the use of two separate analogue sources between the converter and the multiplier means that reconfigurability is poor.

In order to avoid this, fm can be chosen such that fm=fs; this allows the signal used for sampling the digital data to be used to increase the frequency at the output of the converter (U.S. Pat. No. 7,796,971). The analogue signal at the output of the converter will therefore be translated around the sampling frequency fs with a dynamic range always equivalent to that of the first Nyquist zone. However, we cannot always generate signals at frequencies greater than 2fs, since the signal will always be strongly attenuated by the sine cardinal response of the converter, which reduces the system performances. Moreover, this solution is only applicable to current converters.

It is likewise possible to increase the sampling frequency fs. This allows the dynamic range to be increased in the first and second Nyquist zones, but obtaining converters with a wide Nyquist zone and a strong dynamic range is complicated, since in order to achieve high sampling frequencies fs, digital-to-analogue converter cores have to be interleaved and this produces additional parasitic signals and therefore degrades performance.

Yet another possibility is that of performing multiple returns-to-zero on the analogue output signal from the converter (U.S. Pat. No. 8,659,458). If N returns-to-zero are performed, where N is an integer, the signal will be generated around N×fs with low attenuation. This requires the use of a rapid clock signal set on the quantization clock at frequency fs and imposes returns-to-zero, which become shorter and shorter with the increase in N. This only applies to current converters.

The object of the invention is to overcome the aforementioned disadvantages and limitations of the prior art. More specifically, the object is to propose a device for generating analogue signals which allows the output power of a digital-to-analogue converter and the digital bit rate at the input of the converter to be optimized.

An object of the invention is therefore a device for generating analogue signals comprising a digital-to-analogue converter comprising at least one digital input and one analogue output, a circuit for generating a first clock signal of frequency fs, and a digital register configured in such a manner as to receive at the input, and to store, N bits representative of an analogue output signal from the digital-to-analogue converter, N being an integer greater than or equal to 1, and for receiving the first clock signal, the register comprising, for each bit, two complementary digital outputs, characterized in that it likewise comprises a circuit for generating a second clock signal with a frequency m×fs, where m is an integer greater than 1, and N multiplexer circuits, placed between the outputs of the digital register and the inputs of the digital-to-analogue converter and configured such that they each receive, on a control input, the second clock signal and they each receive, on a data input, signals originating from two digital outputs of the register corresponding to the same input bit of the register, in such a manner that the frequency of the signals leaving the multiplexer circuits is 2×m×fs.

According to particular embodiments of the invention:
the circuit for generating the first clock signal and the circuit for generating the second clock signal are combined;
the circuit for generating the first and the second clock signal comprises a clock configured in such a manner as to generate a clock signal at frequency m×fs, and a divider circuit configured in such a manner that the signal at the output of the divider circuit is a clock signal of frequency fs;
the converter is a digital-to-analogue current converter or a digital-to-analogue voltage converter; and
the multiplexer circuits comprise at least one dipole multiplexer.

Another object of the invention is a method for generating analogue signals comprising the following steps:
a) supplying, at the input of a digital register, N bits representative of an analog signal, N being an integer greater than or equal to 1, and applying to this digital register a first clock signal of frequency fs, the register comprising two complementary digital outputs for each input bit;
b) applying a second clock signal of frequency 2×m×fs to N multiplexer circuits, m being an integer greater than or equal to 1, and supplying, at the input of the N multiplexer circuits, signals originating from two complementary digital outputs of the register, the multiplexer circuit n receiving the two outputs originating from the same input bit n, n being an integer included between 1 and N;
c) supplying, at the input of a digital-to-analogue converter, output signals from the N multiplexer circuits;
d) recovering a signal at the output of the converter, said signal originating from a current or voltage value, the spectral response of which is centred around a frequency m×fs.

Other features, details and advantages of the invention will emerge on reading the description given with reference to the attached figures, which are provided by way of example and represent, respectively:

FIG. 1, a device according to a first embodiment of the invention;

FIG. 2, a device according to a second embodiment of the invention;

FIG. 3, a device according to a third embodiment of the invention; and

FIG. 4, a method for generating analogue signals according to the invention.

FIG. 1 presents a device for generating analogue signals according to a first embodiment of the invention. The device comprises a digital register REG which receives digital data to be converted at the input IN. This digital data is, for example, a binary word comprising three bits: B1, B2 and B3. The register REG comprises two complementary outputs for each bit, a first output supplying the bit and a second output supplying its complement, respectively. In the embodiment shown in [FIG. 1], only three inputs for three bits (B1, B2, B3), and six outputs (B1, $\overline{B1}$, B2, $\overline{B2}$, B3, $\overline{B3}$) are represented, but more generally the register can receive N bits at the input, where N is an integer greater than or equal to 1, and will therefore have N inputs and 2N outputs.

A first circuit C1 for generating a clock signal sends a clock signal Clk1 of frequency fs to the register REG, so that the bits and their complements (B1, $\overline{B1}$, B2, $\overline{B2}$, B3, $\overline{B3}$) leave the register REG with a frequency fs.

There is a second circuit C2 for generating a clock signal Clk2. It sends a clock signal Clk2 of frequency m×fs to the control inputs of the multiplexer circuits M1, M2 et M3, where m is an integer greater than 1. The multiplexer circuits M1, M2 and M3, are placed at the output of the register REG. Each multiplexer circuit (M1, M2, M3) receives, at the input, two output signals from the register REG, and more specifically, receives a bit and its complement, so the two output signals correspond to the same input bit in the register REG. Hence, the multiplexer circuit M1 receives (B1, $\overline{B1}$), the circuit M2 (B2, $\overline{B2}$), and the circuit B3, $\overline{B3}$). By virtue of the second clock signal Clk2 of frequency m×fs, each multiplexer circuit will have at the output either bit B1, B2 or B3, or its complement $\overline{B1}$, $\overline{B2}$ or $\overline{B3}$, according to the rising or falling edge of the clock signal Clk2. This makes it possible to obtain the bits, or their complements, at a frequency 2×m×fs at the output of the multiplexer circuits (M1, M2, M3).

The outputs of the multiplexer circuits (M1, M2, M3) are then sent to a digital-to-analogue converter DAC, which comprises three digital inputs IN_DAC and one digital output OUT. Only three inputs IN_DAC are represented in the figure, as there are three bits bit1, bit2 and bit3 at the input of the register REG, but more generally there will be as many inputs as there are bits at the input of the register REG.

The bits are converted into analogue data in the converter DAC and the spectral response of the analogue signal obtained at the output OUT of the converter is centred around the frequency m×fs with a maximum width of fs/2. This enables a sufficient level of power to be retained at high frequency (m×fs) with a rapid clock signal.

FIG. 2 presents a device for generating analogue signals according to a second embodiment of the invention. In this embodiment, as for FIG. 1, only three bits bit1, bit2 and bit3 are represented at the input IN of the digital register REG, but there may be N bits at the input of the register REG, where N is an integer greater than or equal to 1. Unlike in the first embodiment, the circuits for generating two clock signals are combined. There is only a single circuit C for generating a clock signal Clk at a frequency m×fs, where m is an integer greater than or equal to 1. The clock signal Clk is sent straight to the multiplexer circuits M1, M2 and M3, which makes it possible to obtain at the output of the multiplexer circuits M1, M2 and M3, as in [FIG. 1], the bits and their complements at a frequency 2×m×fs. However, before being sent to the register REG, the clock signal Clk first passes through a divider circuit D which divides the frequency of the clock signal by m, thereby allowing there to be a clock signal Clk 1 at the input of the register of frequency fs.

FIG. 3 presents a third embodiment of the invention. An exemplary device according to the invention and a digital-to-analogue converter structure is described. The register REG receives two bits bit1 and bit2 at the input, which emerge from the register at the frequency of the clock signal Clk1, fs, as (B1, $\overline{B1}$) and (B2, $\overline{B2}$). Next (B1, $\overline{B1}$) and (B2, $\overline{B2}$) enter the multiplexer circuits M1 and M2 and emerge at the frequency 2×m×fs, by virtue of the clock signal Clk2 of frequency m×fs sent to the two multiplexer circuits. At the converter input, a register REG DAC receives a clock signal Clk2 of frequency m×fs, coming for example from the second circuit C2 for generating the clock signal or from another circuit for generating clock signals. For each input bit (B1, $\overline{B1}$, B2, $\overline{B2}$), the register REG DAC supplies the bit or its complement at the output. The register REG DAC comprises two outputs for one input: an even output (PAIR1, PAIR2) which supplies the complement of the bit and an odd output (IMP1, IMP2) which supplies the bit. An assembly of two even and odd outputs for the same input bit is referred to as a differential branch. Two differential branches BD1 and BD2 are represented in this embodiment. The two current sources S1 and S2 allow the two differential branches BD1 and BD2 to be supplied. The transistors (T1, T2, T3, T4) present in the two differential branches BD1, BD2 are made into conductors according to the value of the bit (0 or 1) in the register REG DAC. For example, if a bit 1 has emerged on the odd branch IMP1, the transistor T1 will be a conductor, and if a bit 0 has emerged on the odd branch IMP1, then the transistor T2 will be blocked. The opposite applies to the branch PAIR1 and the output bit has to be 0, so that the transistor T2 is a conductor, or the output bit has to be 1, so that the transistor T2 is blocked. The same principle applies to the even and odd outputs of the second differential branch BD2.

The output currents of the odd branches are added up in an adder circuit which is a resistor R1 in this embodiment. The output currents of the even branches are likewise added up in an adder circuit which is likewise a resistor R2 in this embodiment. The difference in voltage between the voltages at the resistor terminals R1 and R2 represents the digital value of the binary word to be converted, supplied at the input IN of the device with the bits bit1 and bit2. This voltage difference is supplied on the output OUT of the converter DAC. Depending on the type of converter, in other words current or voltage converter, the output OUT is a current or voltage value.

According to another embodiment of the invention, the multiplexer circuits (M1, M2, M3) comprise at least one bipolar multiplexer.

According to another embodiment, the DAC converter comprises bipolar transistors.

According to another embodiment, the DAC converter comprises MOSFET transistors, in other words, insulated-gate field-effect transistors.

According to another embodiment, the DAC converter is a voltage converter. According to multiple embodiments, the DAC converter is, more particularly:
- a digital-to-analogue converter with a switched capacity, the switches of which are controlled according to the values of bits at the input of the converter;
- a digital-to-analogue converter with resistor networks R/2R; or
- a digital-to-analogue converter with a weighted resistor.

These three converters generally operate at a lower frequency than a digital-to-analogue current converter.

FIG. 4 presents a method for generating analogue signals according to the invention. The first step (step a) involves supplying N bits representative of an analogue signal at the input of a digital register, N being an integer greater than or equal to 1, and applying to this digital register a first clock signal of frequency fs, the register comprising two complementary digital outputs for each input bit. The following step b involves applying a second clock signal of frequency 2×m×fs to N multiplexer circuits, m being an integer greater than or equal to 1, and to supply signals originating from two complementary digital outputs of the register at the input of the N multiplexer circuits, the multiplexer circuit n receiving the two outputs originating from the same input bit n, n being an integer between 1 and N. Then in step c, the output signals of the N multiplexer circuits are supplied at the input of a digital-to-analogue converter and finally in the last step (step d), the output signal from the converter which corresponds to a voltage or current value, the spectral response of which is centred around the frequency m×fs, is recovered.

This method of generating analogue signals can be implemented on a device according to the invention, such as those described previously.

The invention claimed is:

1. Device for generating analogue signals comprising:
   a digital-to-analogue converter comprising at least one digital input and one analogue output;
   a circuit for generating a first clock signal of frequency fs;
   a digital register configured in such a manner as to receive at the input, and to store, N bits representative of an analogue output signal from the digital-to-analogue converter, N being an integer greater than or equal to 1, and for receiving the first clock signal, the register comprising, for each bit, two complementary digital outputs; and
   a circuit for generating a second clock signal with a frequency m×fs, where m is an integer greater than 1, and N multiplexer circuits, placed between the outputs of the digital register and the inputs of the digital-to-analogue converter and configured such that they each receive, on a control input, the second clock signal and they each receive, on a data input, signals originating from two digital outputs of the register corresponding to the same input bit of the register, in such a manner that the frequency of the signals leaving the multiplexer circuits is 2×m×fs.

2. Device for generating analogue signals according to claim 1, wherein the circuit for generating the first clock signal and the circuit for generating the second clock signal are combined.

3. Device for generating analogue signals according to claim 2, wherein the circuit for generating the first clock signal and the circuit for generating the second clock signal each comprises a clock configured to generate a clock signal at frequency m×fs, and a divider circuit configured so that the signal at the output of the divider circuit is a clock signal of frequency fs.

4. Device for generating analogue signals according to claim 3, wherein the converter is a digital-to-analogue current converter.

5. Device for generating analogue signals according to claim 3, wherein the converter is a digital-to-analogue voltage converter.

6. Device for generating analogue signals according to claim 1, wherein the converter is a digital-to-analogue current converter.

7. Device for generating analogue signals according to claim 1, wherein the converter is a digital-to-analogue voltage converter.

8. Device for generating analogue signals according to claim 7, wherein the multiplexer circuits comprise at least one dipole multiplexer.

9. Device for generating analogue signals according to claim 1, wherein the multiplexer circuits comprise at least one dipole multiplexer.

10. Method for generating analogue signals comprising:
   supplying, at an input of a digital register, N bits representative of an analog signal, N being an integer greater than or equal to 1, and applying to this digital register a first clock signal of frequency fs, the register comprising two complementary digital outputs for each input bit;
   applying a second clock signal of frequency 2×m×fs to N multiplexer circuits, m being an integer greater than or equal to 1, and supplying, at the input of the N multiplexer circuits, signals originating from two complementary digital outputs of the register, the multiplexer circuit n receiving the two outputs originating from the same input bit n, n being an integer included between 1 and N;
   supplying, at an input of a digital-to-analogue converter, output signals from the N multiplexer circuits; and
   recovering a signal at an output of the converter, said signal originating from a current or voltage value, the spectral response of which is centered around a frequency m×fs.

* * * * *